(12) United States Patent
Chung et al.

(10) Patent No.: US 10,361,150 B2
(45) Date of Patent: Jul. 23, 2019

(54) SUBSTRATE CONSTRUCTION AND ELECTRONIC PACKAGE INCLUDING THE SAME

(71) Applicant: Siliconware Precision Industries Co., Ltd., Taichung (TW)

(72) Inventors: Chee-Key Chung, Taichung (TW); Yu-Min Lo, Taichung (TW); Han-Hung Chen, Taichung (TW); Chang-Fu Lin, Taichung (TW); Fu-Tang Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/590,111

(22) Filed: May 9, 2017

(65) Prior Publication Data

US 2018/0269142 A1 Sep. 20, 2018

(30) Foreign Application Priority Data

Mar. 15, 2017 (TW) .............................. 106108535 A

(51) Int. Cl.
*H01L 23/14* (2006.01)
*H01L 23/28* (2006.01)
*H01L 23/31* (2006.01)
*H01L 23/498* (2006.01)

(52) U.S. Cl.
CPC ........ *H01L 23/49827* (2013.01); *H01L 23/14* (2013.01); *H01L 23/28* (2013.01); *H01L 23/3128* (2013.01); *H01L 23/3135* (2013.01); *H01L 2224/32225* (2013.01); *H01L 2224/73204* (2013.01); *H01L 2924/181* (2013.01); *H01L 2924/18161* (2013.01)

(58) Field of Classification Search
CPC ................................ H01L 24/80; H01L 24/91
See application file for complete search history.

(56) References Cited

U.S. PATENT DOCUMENTS

| 2012/0061824 | A1* | 3/2012 | Pagaila | H01L 21/568 257/737 |
| 2014/0254120 | A1* | 9/2014 | Yamamoto | H05K 3/0094 361/772 |
| 2015/0048503 | A1* | 2/2015 | Chiu | H01L 24/97 257/738 |
| 2015/0140286 | A1* | 5/2015 | Shen | H01L 23/49827 428/195.1 |
| 2018/0045885 | A1* | 2/2018 | Canali | G02B 6/12002 |

* cited by examiner

*Primary Examiner* — Su C Kim
*Assistant Examiner* — David S Wilbert
(74) *Attorney, Agent, or Firm* — Mintz Levin Cohn Ferris Glovsky and Popeo, P.C.; Peter F. Corless; Steven M. Jensen

(57) ABSTRACT

The disclosure provides a substrate construction applicable to a 3D package, including a silicon substrate for carrying a chip on an upper side thereof, and a circuit structure formed underneath the silicon substrate for being connected to solder balls via conductive pads of the circuit structure, thereby obtaining the same specification of the conductive pads as ball-planting pads of conventional package substrates and avoiding the manufacturing and use of conventional package substrates.

30 Claims, 5 Drawing Sheets

SUBSTRATE CONSTRUCTION AND ELECTRONIC PACKAGE INCLUDING THE SAME

CROSS-REFERENCE TO RELATED APPLICATION

This application claims under 35 U.S.C. § 119(a) the benefit of Taiwanese Patent Application No. 106108535 filed Mar. 15, 2017, the entire contents of which are incorporated herein by reference.

BACKGROUND

Technical Field

The disclosure relates to semiconductor packaging processes, and, more particularly, to a substrate construction and an electronic package including the same.

Description of Related Art

With the rapid development of electronic industry, the demands for multi-functional and high-performance electronic products are increasing. There are numerous techniques used in the field of chip packaging, including flip-chip modules, such as Chip Scale Package (CSP), Direct Chip Attached (DCA) or Multi-Chip Module (MCM), or three-dimension (3D) IC chip-stacked modules in which chips are stacked and integrated in a 3D manner.

FIG. 1 is a schematic cross-sectional view illustrating a semiconductor package 1 of a conventional 3D IC chip-stacked module. First, a Through Silicon Interposer (TSI) 10 including an interconnecting side 10a and a chip placement side 10b opposite to each other is provided. The TSI 10 includes a plurality of Through Silicon Vias (TSVs) 100 connected with the interconnecting side 10a and the chip placement side 10b. A circuit structure 11 is formed on top of the chip placement side 10b for being connected with semiconductor chips 13 with solder bumps 130 having a smaller interval. Then, the interconnecting side 10a of the TSI 10 is disposed on a package substrate 18 with a larger line spacing via a plurality of conductive elements 101. The package substrate 18 is then electrically connected to the TSVs 100. The distance between the conductive elements 101 is between 40 and 70 µm. The width D of the conductive elements 101 is between 25 and 50 µm. Thereafter, an encapsulant 14 is formed on the package substrate 18 for encapsulating the semiconductor chips 13 and the TSI 10. Finally, a plurality of solder balls 12 are disposed underneath ball-planting pads 180 of the package substrate 18 for being connected to a circuit board 19. The distance R between the ball-planting pads 180 (or solder balls 12) is between 200 and 1500 µm, and the maximum width W of the ball-planting pads 180 (or solder balls 12) is between 150 and 800 µm.

In the above semiconductor package 1, as the demand for miniaturization of the semiconductor chip 13 increases, the area of the interconnecting side 10a (or the chip placement side 10b) of the TSI 10 becomes smaller. When the area of the interconnecting side 10a (or the chip placement side 10b) of the TSI 10 is very small, the package substrate 18 largely affects the warpage of the semiconductor package 1.

More specifically, the package substrate 18 is made of an organic material, so there will be a mismatch in thermal expansion coefficients (CTE) of the package substrate 18 and the TSI 10, causing uneven distribution of thermal stress, and large amount of warpage would occur in the package substrate 18 during thermal cycles, resulting in numerous reliability issues, such as poor planting of the balls (e.g., falling off the solder balls 12), non-wetting of the solder balls, or cracks appearing in the package substrate 18 etc., which in turn causes reliability issues in end products (e.g., computers, mobile phones etc.) that employs these semiconductor packages 1.

Moreover, the thickness L of the package substrate 18 is very large (e.g., from about 100 to about 500 µm), such that the overall height of the conventional semiconductor package 1 exceeds 1 mm (current requirement for the thickness of the package is generally less than 1 mm). In addition, the TSI 10 has to be provided on the package substrate 18 via the conductive elements 101, which makes it more difficult to reduce the overall thickness of the semiconductor package 1, and more difficult for the electronic products using the semiconductor packages 1 to meet the demand for miniaturization.

Therefore, there is a need for a solution that addresses the aforementioned issues in the prior art.

SUMMARY

In view of the aforementioned shortcomings of the prior art, the disclosure provides a substrate construction, which may include: a silicon-containing substrate including a first side and a second side opposite to the first side; a plurality of conductive pillars formed in the silicon-containing substrate; and a circuit structure formed on the first side of the silicon-containing substrate and electrically connected with the conductive pillars, wherein the circuit structure includes a plurality of conductive pads each having a width ranging from 150 to 800 µm, and any two of the conductive pads are spaced apart at a distance ranging from 200 to 1500 µm.

In an embodiment, the circuit structure includes at least a dielectric layer, a circuit layer provided on the at least a dielectric layer, and a plurality of conductive vias provided in the at least a dielectric layer and electrically connected with the circuit layer, and the circuit layer at an outermost side of the circuit structure serves as the conductive pads.

In an embodiment, the length of the silicon-containing substrate is from 3 to 125 mm, preferably from 10 to 90 mm.

In an embodiment, the width of the silicon-containing substrate is from 3 to 125 mm, preferably from 10 to 90 mm.

In an embodiment, the silicon-containing substrate is defined with a through-hole region and a substrate region adjacent to the through-hole region, the substrate region surrounds the through-hole region, and the conductive pillars are located in the through-hole region. In another embodiment, the conductive pads are located in the through-hole region and the substrate region. In yet another embodiment, the area of the through-hole region with respect to the first side of the silicon-containing substrate is smaller than the area of the substrate region with respect to the first side of the silicon-containing substrate.

In an embodiment, the distance is preferably from 250 to 1350 µm.

In an embodiment, the width of the conductive pads is preferably from 180 to 750 µm.

In an embodiment, the substrate construction may further include an insulating protective layer formed on the circuit structure, with the conductive pads exposed from the insulating protective layer.

In an embodiment, the substrate construction may further include an insulating protective layer formed on the second side of the silicon-containing substrate, with the conductive pillars exposed from the insulating protective layer.

In an embodiment, the substrate construction may further include a circuit portion formed on the second side of the silicon-containing substrate and electrically connected with the conductive pillars.

The disclosure also provides an electronic package, which may include: the above substrate construction; and an electronic component provided on the second side of the silicon-containing substrate and electrically connected with the conductive pillars.

In an embodiment, the electronic package may further include an encapsulating layer formed between the second side of the silicon-containing substrate and the electronic component.

In an embodiment, the electronic package may further include a first packaging material formed on the silicon-containing substrate and encapsulating the electronic component, and the first packaging material can be optionally formed between the second side of the silicon-containing substrate and the electronic component. In another embodiment, a portion of a surface of the electronic component is exposed from the first packaging material. In yet another embodiment, the first packaging material further extends onto a side surface of the silicon-containing substrate. In still another embodiment, the first packaging material further extends onto the circuit structure.

In an embodiment, the electronic package may further include a second packaging material formed on the first packaging material. In another embodiment, the second packaging material further extends onto a side surface of the silicon-containing substrate. In yet another embodiment, the second packaging material further extends onto the circuit structure. In still another embodiment, a portion of a surface of the electronic component is exposed from the first and second packaging materials.

In an embodiment, a portion of a surface of the electronic component is exposed from the first packaging material.

In an embodiment, the electronic package may further include a plurality of conductive elements provided on and electrically connected with the conductive pads.

It can be understood from the above that the substrate construction and the electronic device including the same according to the disclosure eliminate the need for the conventional package substrate, and allow the silicon-containing substrate to be combined onto a circuit board directly through the conductive pads of the circuit structure. Also, the CTEs of the electronic component and the silicon-containing substrate match each other. Therefore, compared to the prior art, the electronic device according to the disclosure avoids warpage and effectively increases reliability, which in turn increases the reliability of end products that use the electronic device according to the disclosure.

Moreover, since the electronic device according to the disclosure eliminates the conventional package substrate, this greatly reduces the thickness of the electronic device according to the disclosure. Therefore, the end products using the electronic device according to the disclosure are able to meet the demand for miniaturization.

Furthermore, in terms of the manufacturing process, since the electronic device according to the disclosure eliminates the need for the conventional package substrate, the step for disposing the conventional TSI on the package substrate can be eliminated, thereby reducing the manufacturing time and increasing throughput.

In addition, from the perspective of the end products, since the conventional package substrate is eliminated, and the layout specification of the conductive pads according to the disclosure is substantially the same as the layout specification for the conventional ball-planting pads, only the circuit layouts for the silicon-containing substrate and the motherboard need to be designed, and there is no need to consider the circuit layout for the conventional package substrate, thereby reducing the manufacturing time and cost, and increasing the throughput and economic efficiency of the end products.

In order to facilitate understanding of the aforementioned features and advantages according to the disclosure, embodiments thereof are described in conjunction with illustration of the appended drawings. In the following descriptions, additional features and advantages of the disclosure are partially described, such features and advantages may become apparent from the descriptions or through implementations of the disclosure. The features and advantages of the disclosure can be appreciated and achieved with the help of the elements and various combinations thereof given by the appended claims. It should be understood that the aforementioned general descriptions and the following detailed descriptions are for illustrative and explanatory purposes only, and are by no means intended to limit the scope of the disclosure set forth by the appended claims.

BRIEF DESCRIPTION OF THE DRAWINGS

FIG. 2A' is a bottom view of FIG. 2A;

FIG. 2C' is a schematic cross-sectional view of another embodiment of FIG. 2C;

DETAILED DESCRIPTION OF THE EMBODIMENTS

Figure 1:
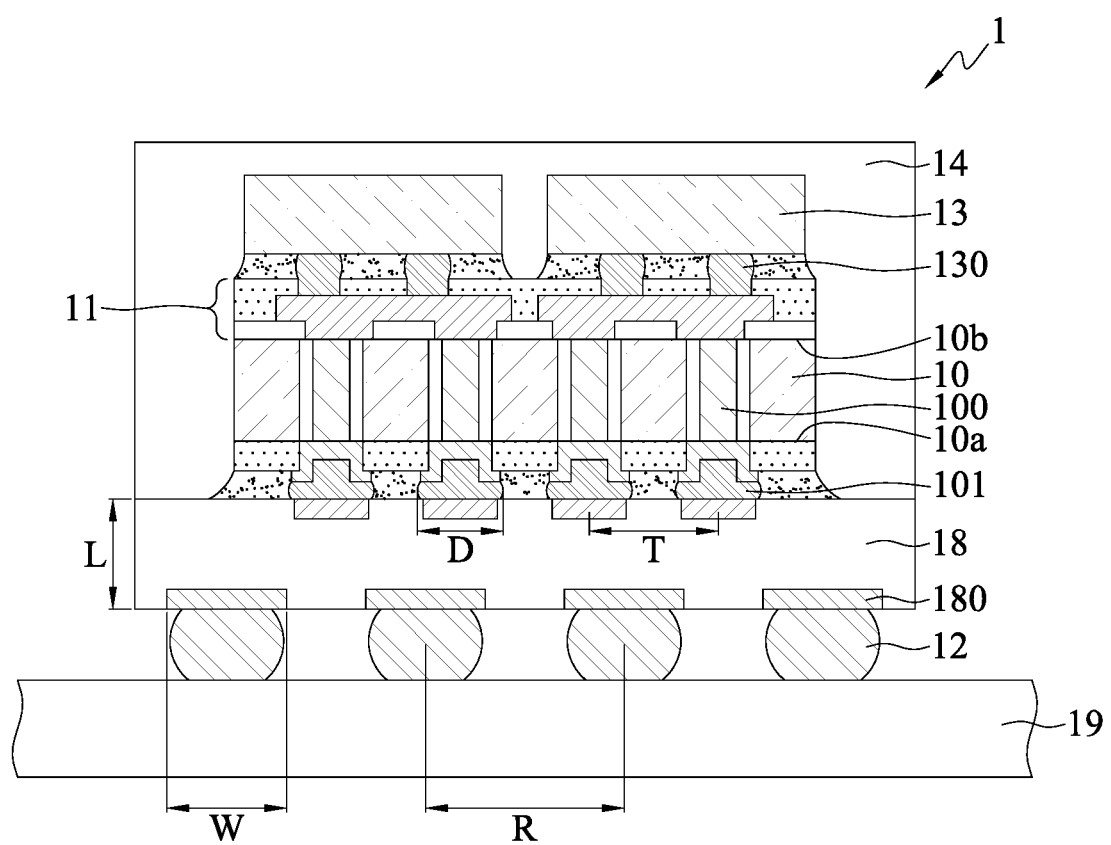
FIG. 1 is a schematic cross-sectional view illustrating a conventional semiconductor package.

The disclosure is described by the following specific embodiments. Those with ordinary skills in the arts can readily understand other advantages and functions of the disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the disclosure, and therefore have no substantial technical meaning. Without affecting the effects created and objectives achieved by the disclosure, any modifications, changes or adjustments to the structures, ratio relationships or sizes, are to be construed as fall within the range covered by the technical contents disclosed herein.

Meanwhile, terms, such as "above", "below", "first", "second", "a" and the like, are for illustrative purposes only, and are not meant to limit the range implementable by the disclosure. Any changes or adjustments made to their relative relationships, without modifying the substantial technical contents, are also to be construed as within the range implementable by the disclosure.

FIGS. 2A to 2E are schematic cross-sectional views illustrating a method for manufacturing an electronic package 2 in accordance with the disclosure.

Figure 2A:
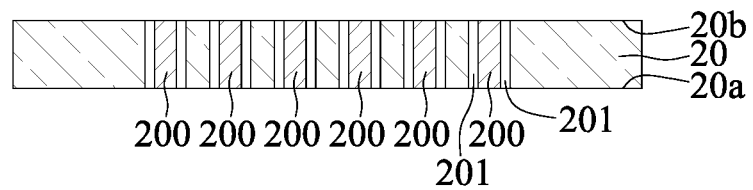
FIGS. 2A to 2E are schematic cross-sectional views illustrating a method for manufacturing an electronic package in accordance with the disclosure.
Figure 2A:
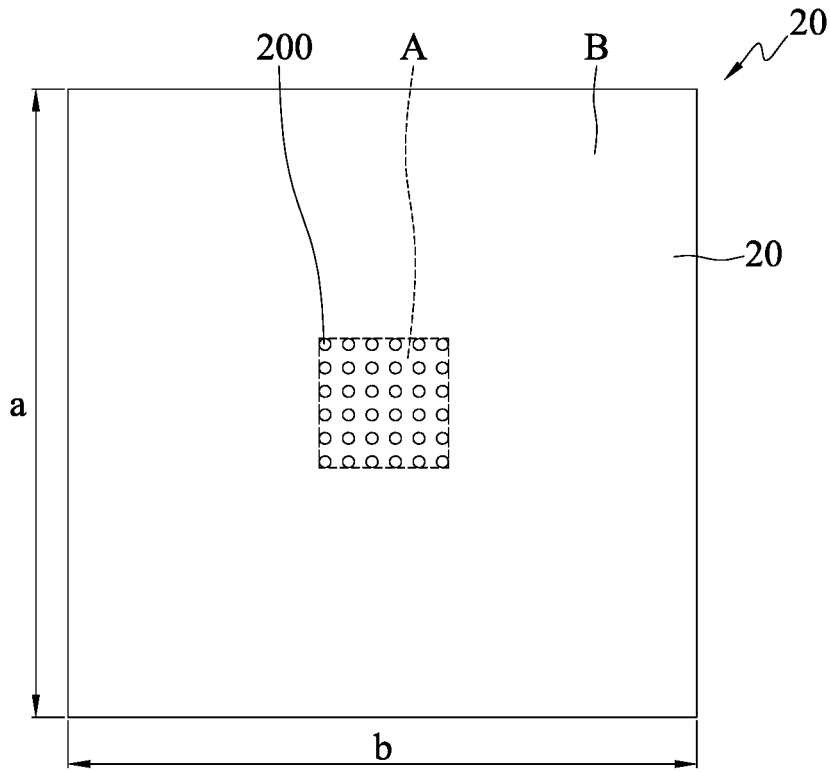

As shown in FIG. 2A, a silicon-containing substrate 20 is provided, which includes a first side 20a, a second side 20b opposite to the first side 20a, and a plurality of conductive pillars 200 connected with the first and second sides 20a and 20b and formed in the silicon-containing substrate 20.

In an embodiment, the silicon-containing substrate 20 can be a substrate containing a silicon material, such as a Through Silicon Interposer (TSI), glass, etc. The conductive pillars 200 are metal pillars, such as copper pillars. For example, the conductive pillars 200 can manufactured be based on the manufacturing process for Through Silicon Vias (TSVs), in which a plurality of through holes are first formed on the surface of the silicon-containing substrate 20, an insulating layer 201 is then formed on the walls of these through holes, and then a conductive material (e.g., copper) is filled in the through holes, thereby forming the conductive pillars 200. A leveling process is then applied to the conductive pillars 200, such that the ends of the conductive pillars 200 are level with the surfaces of the silicon-containing substrate 20. It can be appreciated that other manufacturing processes can be used for making these conductive pillars 200, and the disclosure is not limited to that described herein.

Moreover, the silicon-containing substrate 20 is a rectangle or square, as shown in FIG. 2A', its length a is 3 to 125 mm, preferably 10 to 90 mm, and its width is 3 to 125 mm, preferably 10 to 90 mm.

Furthermore, the silicon-containing substrate 20 is defined with a through-hole region A and a substrate region B adjacent to the though-hole region A. The substrate region B surrounds the through-hole region A, and the conductive pillars 200 are provided in the through-hole region A. In an embodiment, as shown in FIG. 2A', the area of the first side 20a of the silicon-containing substrate 20 can be 50×50 mm$^2$, and the through-hole region A on the first side 20a can be a square with an area of 5×5 mm$^2$, such that the area of the through-hole region A on the first side 20a is smaller than the area of the substrate region B on the first side 20a.

In addition, the first side 20a can be regarded as an interconnecting side, while the second side 20b can be regarded as a chip placement side.

Figure 2B:
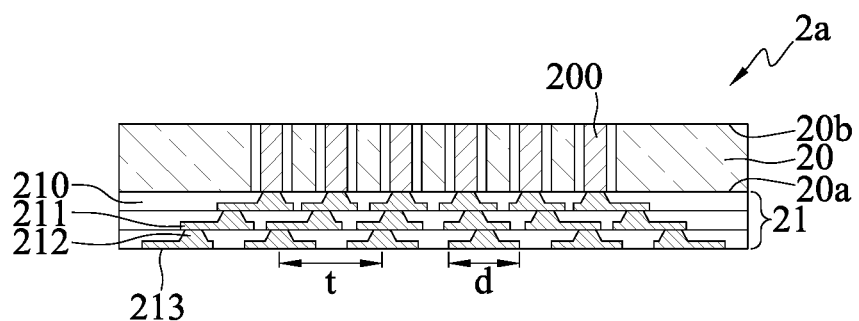

As shown in FIG. 2B, a circuit structure 21 is formed on the first side 20a of the silicon-containing substrate 20, thereby creating a substrate construction 2a.

In an embodiment, the circuit structure 21 can be laid out according to needs using a Redistribution layer (RDL) manufacturing process, for example, on the through-hole region A and the substrate region B, and there is no particular limitation.

Furthermore, the circuit structure 21 includes at least a dielectric layer 210, a circuit layer 211 provided on the dielectric layer 210, and a plurality of conductive vias 212 provided in the dielectric layer 210 and electrically connected with the circuit layer 211. The circuit layer 211 includes a plurality of conductive pads 213, and the circuit layer 211 is electrically connected to the conductive pillars 200 through a portion of the conductive vias 212. The distance t between two of the conductive pads 213 is from 200 to 1500 μm, preferably from 250 to 1350 μm, and the maximum width d of each of the conductive pads 213 is from 150 to 800 μm, preferably from 180 to 750 μm.

Moreover, the dielectric layer 210 can be made of a prepreg, a photosensitive medium, polyimide (PI) or polybenzoxazole (PBO) or other suitable materials.

In addition, the layout specification for the conductive pads 213 is generally the same as that for conventional ball-planting pads 180, that is, the distances t, R of the two are substantially the same and the widths d, W of the two are substantially the same.

Figure 2C:
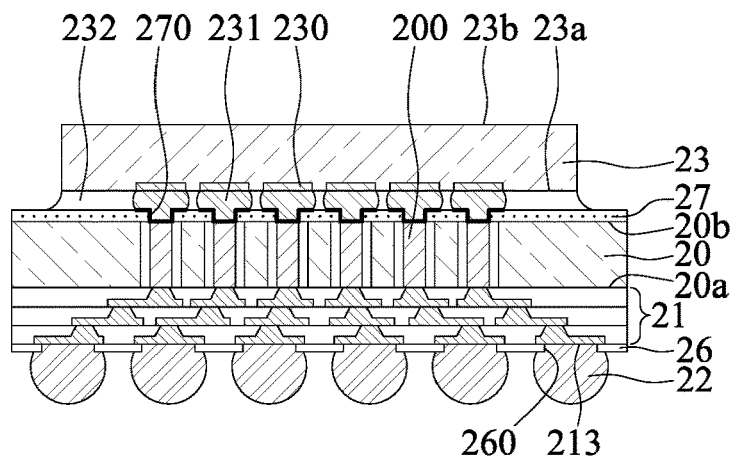
Figure 2C:
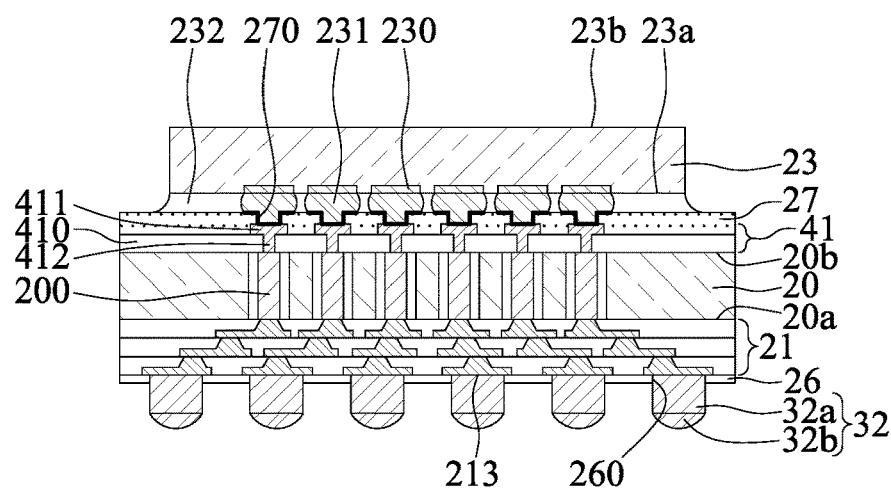

As shown in FIG. 2C, at least one electronic component 23 is provided on the second side 20b of the silicon-containing substrate 20, and is electrically connected to the conductive pillars 200. A plurality of conductive elements 22 are formed on the circuit structure 21 on the first side 20a of the silicon-containing substrate 20, such that they are formed in the through-hole region A and the substrate region B and are electrically connected to the conductive pads 213 of the circuit structure 21, wherein the distance between two of the conductive elements 22 and the maximum width of each of the conductive elements 22 are substantially the same as the layout specification for the conductive pads 213.

In an embodiment, the electronic component 23 can be a semiconductor material, such as a passive element, an active element or a combination of the above. In an embodiment, the active element can be, for example, a semiconductor chip, and the passive element can be, for example, a resistor, a capacitor or an inductor. More specifically, the electronic component 23 is an active element with an active surface 23a and a non-active surface 23b opposite to the active surface 23a. The active surface 23a includes a plurality of electrode pads 230, and the electrode pads 230 are provided on the second side 20b of the silicon-containing substrate 20 and electrically connected with the conductive pillars 200 in a flip-chip manner via a plurality of conductive bumps 231 (e.g., a solder material). An encapsulating layer 232 such as an underfill is formed between the second side 20b of the silicon-containing substrate 20 and the electronic component 23 to encapsulate the conductive bumps 231. Alternatively, the electronic component can be electrically connected to the conductive pillars 200 through a plurality of wires (not shown) by wire bonding. Alternatively, the electronic component can be in direct contact with the conductive pillars 200. However, the way in which the electronic component is electrically connected with the conductive pillars 200 is not limited to those described above.

Furthermore, the conductive elements 22 are made of a solder material, and its layout specification is substantially the same as that of the convectional solder balls 12, that is, the distance and the widths of the two are substantially the same. Alternatively, as shown in FIG. 2C' (or an electronic package 3 shown in FIG. 3), conductive elements 32 also include conductive pillars 32a and a solder material 32b formed on the conductive pillars 32a, wherein the conductive pillars 32a can be metal pillars made of copper or other materials, for example.

Moreover, before the conductive elements 22 are formed, a first insulating protective layer 26 can be optionally formed on the circuit structure 21, and a plurality of first openings 260 are formed in the first insulating protective layer 26, such that the conductive pads 213 are exposed from the first openings 260, and the conductive elements 22 are formed on the conductive pads 213 exposed from the first openings 260. Alternatively, a single opening (not shown) is formed in the first insulating protective layer 26 for exposing the conductive pads 213.

Furthermore, as shown in FIG. 2C', a circuit portion 41 can be optionally formed on the second side 20b of the silicon-containing substrate 20 using the RDL manufacturing process. The circuit portion 41 includes at least a dielectric layer 410, a circuit layer 411 provided on the dielectric layer 410, and a plurality of conductive vias 412 provided in the dielectric layer 410 and electrically connected with the circuit layer 411 and the conductive pillars 200.

Figure 2D:
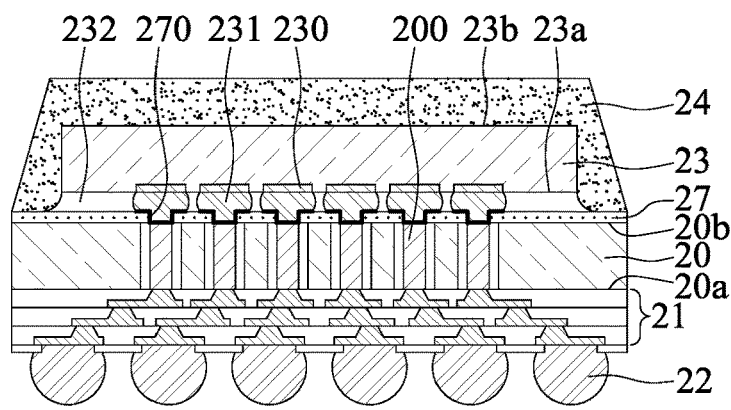

As shown in FIG. 2D, continuing from the step shown in FIG. 2C, a first packaging material 24 is formed on the second side 20b of the silicon-containing substrate 20 for encapsulating the electronic component 23.

In an embodiment, the first packaging material 24 can be made of an insulating material, such as polyimide (PI), a dry film, an epoxy resin or a molding compound.

Figure 3:
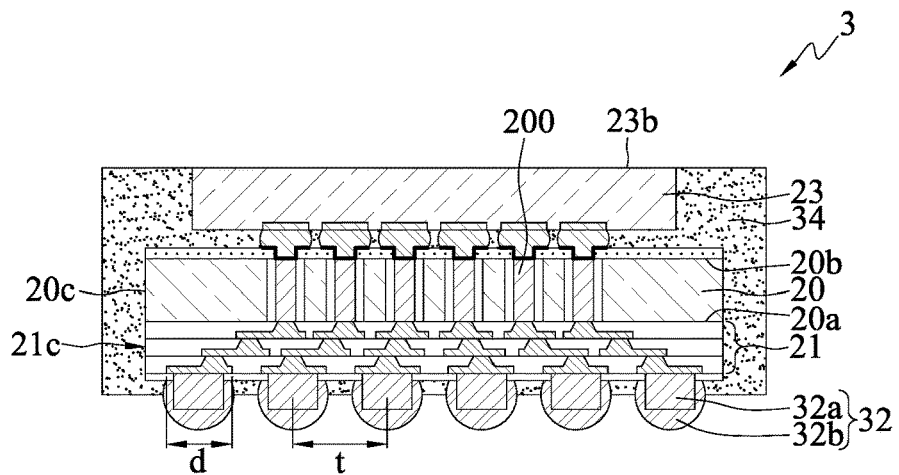
FIG. 3 is a schematic cross-sectional view of another embodiment of FIG. 2D.

Further, as shown in FIG. 3, the first packaging material 24 can also be formed between the second side 20b of the silicon-containing substrate 20 and the electronic component 23 for encapsulating the conductive bumps 231 without the need for the encapsulating layer 232.

Moreover, before the electronic component 23 is provided, a second insulating protective layer 27 is formed on the second side 20b of the silicon-containing substrate 20, and a plurality of second openings 270 are formed in the second insulating protective layer 27 for exposing the ends of the conductive pillars 200, such that the conductive bumps 231 can be connected with the conductive pillars 200 exposed from the second openings 270. Alternatively, continuing from the step shown in FIG. 2C', an semiconductor package 4 shown in FIG. 4, the second insulating protective layer 27 is formed on the dielectric layer 410 of the circuit portion 41, such that a portion of a surface of the circuit layer 411 of the circuit portion 41 is exposed from the second openings 270, and the conductive bumps 231 are disposed on the circuit layer 411 of the circuit portion 41 exposed from the second openings 270.

Figure 2E:
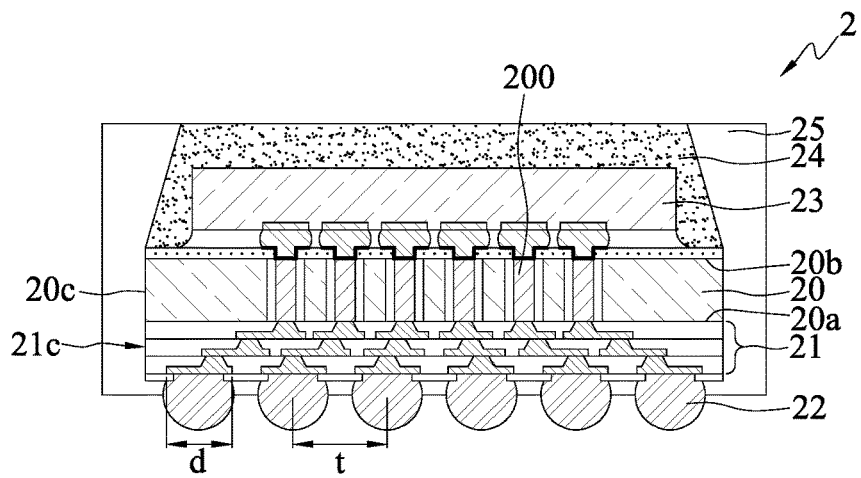

On the other hand, as shown in FIG. 2E, a second packaging material 25 can be optionally formed on the first packaging material 24. In an embodiment, the second packaging material 25 can be made of an insulating material, such as polyimide (PI), a dry film, an epoxy resin or a molding compound. Thus, the material of the second packaging material 25 can be the same or different from the material of the first packaging material 24. In an embodiment, the second packaging material 25 can be extended onto a side surface 20c of the silicon-containing substrate 20 and a side surface 21c of the circuit structure 21, or even onto a portion of a surface of the conductive elements 22 in such a way that the conductive elements 22 are exposed from the second packaging material 25, allowing them to be disposed on an electronic device, such as a motherboard 49 shown in FIG. 4 (or a circuit board 19 shown in FIG. 1), and thereby increasing the structural strength of the conductive elements 22.

Figure 4:
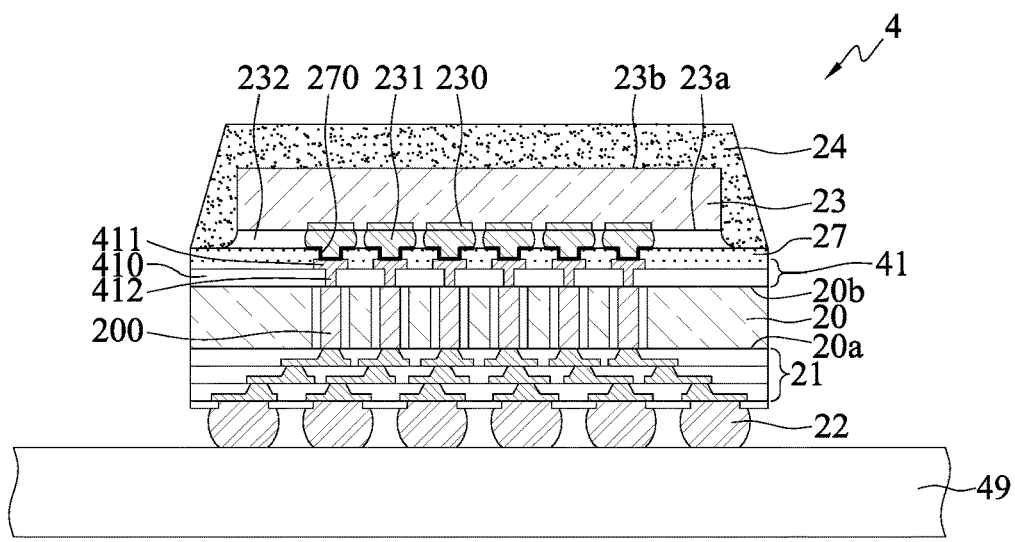
FIG. 4 is a schematic cross-sectional view of still another embodiment of FIG. 2D.
Figure 5A:
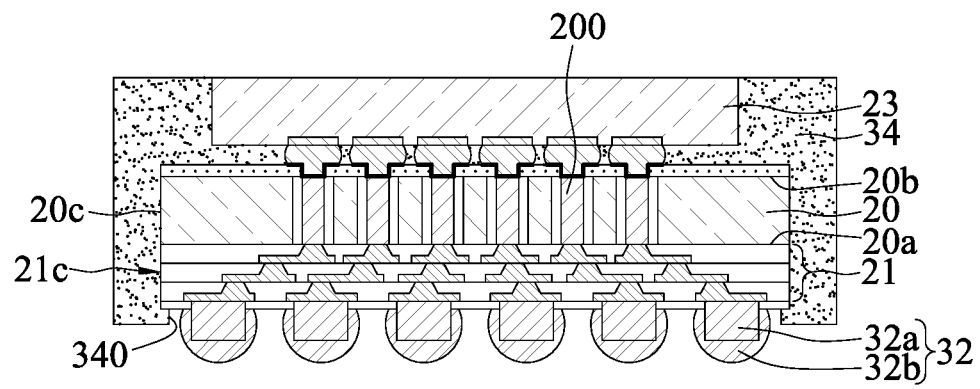
FIG. 5A is a schematic cross-sectional view of another embodiment of FIG. 3.

It can be appreciated that, as shown in FIG. 3, when the first packaging material 34 is manufactured, the first packaging material 34 can be similarly extended onto the side surface 20c of the silicon-containing substrate 20 and the side surface 21c of the circuit structure 21, or even onto a portion of a surface of the conductive elements 32 in such a way that the conductive elements 32 are exposed from the first packaging material 34, allowing them to be disposed on an electronic device such as a motherboard 49 shown in FIG. 4. Alternatively, as shown in FIG. 5A, the first packaging material 34 extends onto the circuit structure 21 (or the first insulating protective layer 26), but is not in contact with the conductive elements 32, such that the conductive elements 32 are exposed from the first packaging material 34, for example, a first opening 340 receiving the conductive elements 32 therein is formed in the first packaging material 34.

Moreover, as shown in FIG. 3, a portion of a surface of the electronic component 23 can be optionally exposed from the first packaging material 34, for example, and a non-active surface 23b of the electronic component 23 is flush with the surface of the first packaging material 34.

Figure 5B:
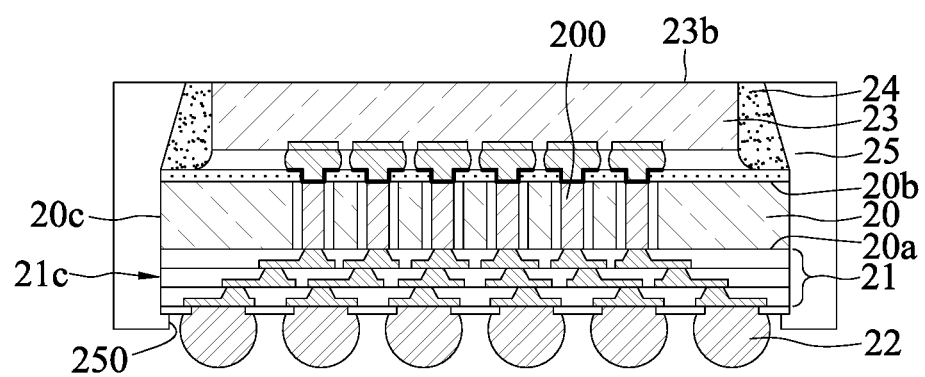
FIG. 5B is a schematic cross-sectional view of another embodiment of FIG. 2E.

Similarly, as shown in FIG. 5B, a second opening 250 for receiving the conductive elements 32 can also be formed in the second packaging material 25 shown in FIG. 2E, such that the second packaging material 25 extends onto the circuit structure 21 (or the first insulating protective layer 26), but is not in contact with the conductive elements 22, such that the conductive elements 22 are exposed from the second packaging material 25. Alternatively, as shown in FIG. 5B, the non-active surface 21b of the circuit structure 21 shown in FIG. 2E is flush with a surface of the first packaging material 24 and a surface of the second packaging material 25, such that the non-active surface 23b of the electronic component 23 is exposed from the first and second packaging materials 24 and 25.

In summary, the substrate construction 2a and the electronic device 2, 3, 4 including the same according to the disclosure effectively turn a standard TSI into a substrate (e.g., through the provision of the substrate region B), thereby eliminating the conventional package substrate, and allowing the silicon-containing substrate 20 to be combined onto an external device (e.g., the motherboard 49) via the conductive pads 213 of the circuit structure 21. In other words, the substrate construction 2a replaces the conventional TSI and the package substrate, and both the electronic component 23 and the silicon-containing substrate 20 are made of semiconductor materials, so the CTEs of the two match each other. Therefore, compared to the prior art, the electronic device 2, 3, 4 according to the disclosure avoids warpage and effectively increases reliability, which in turn increasing the reliability of end products that use the electronic device 2, 3, 4 according to the disclosure.

Moreover, since the electronic device 2, 3, 4 according to the disclosure eliminates the conventional package substrate, the thickness of the electronic device 2, 3, 4 according to the disclosure is greatly reduced. Moreover, the silicon-containing substrate 20 can be directly combined with the circuit structure 21 (that is, eliminating the need for conventional conductive elements 101 shown in FIG. 1), further reduces the thickness of the electronic device 2, 3, 4 according to the disclosure. Therefore, the end products using the electronic device 2, 3, 4 according to the disclosure are able to meet the demand for miniaturization.

Furthermore, in terms of the manufacturing process, since the electronic device 2, 3, 4 according to the disclosure eliminates the need for the conventional package substrate, the step for disposing the conventional TSI 10 on the package substrate 18 can be eliminated, reducing the manufacturing time and increasing throughput.

In addition, from the perspective of the end products, since the conventional package substrate is eliminated, and the layout specification of the conductive pads 213 according to the disclosure is substantially the same as the layout specification for the conventional ball-planting pads, only the circuit layouts for the silicon-containing substrate 20 (or the circuit structure 21) and the motherboard 49 need to be designed, and there is no need to consider the circuit layout for the conventional package substrate 18, thus reducing the manufacturing time and cost, and increasing the throughput and economic efficiency of the end products.

The above embodiments are only used to illustrate the principles of the disclosure, and should not be construed as to limit the disclosure in any way. The above embodiments can be modified by those with ordinary skill in the art without departing from the scope of the disclosure as defined in the following appended claims.

What is claimed is:

1. An electronic package, comprising:
   a silicon-containing substrate including a first side and a second side opposite to the first side;
   a plurality of conductive pillars formed in the silicon-containing substrate;
   a circuit structure formed on the first side of the silicon-containing substrate and electrically connected with the conductive pillars, wherein the circuit structure includes a plurality of conductive pads each having a width ranging from 150 µm to 800 µm, and any two of the conductive pads are spaced apart at a distance ranging from 200 µm to 1500 µm;
   an electronic component provided on the second side of the silicon-containing substrate and electrically connected with the conductive pillars;
   a first packaging material formed on the silicon-containing substrate and encapsulating the electronic component; and
   a second packaging material formed on the first packaging material and extending onto a side surface of the silicon-containing substrate and the circuit structure.

2. The electronic package of claim 1, wherein the circuit structure further includes at least a dielectric layer, a circuit layer formed on the at least a dielectric layer, and a plurality of conductive vias provided in the at least a dielectric layer and electrically connected with the circuit layer.

3. The electronic package of claim 1, wherein the circuit layer at an outermost side of the circuit structure serves as the conductive pads.

4. The electronic package of claim 1, wherein the silicon-containing substrate has a length or a width ranging from 3 mm to 125 mm.

5. The electronic package of claim 4, wherein at least one of the length and the width of the silicon-containing substrate is from 10 mm to 90 mm.

6. The electronic package of claim 1, wherein the silicon-containing substrate is defined with a through-hole region and a substrate region adjacent to the through-hole region, and wherein the substrate region surrounds the through-hole region, and the conductive pillars are located in the through-hole region.

7. The electronic package of claim 6, wherein the conductive pads are located in at least one of the through-hole region and the substrate region.

8. The electronic package of claim 6, wherein an area of the through-hole region with respect to the first side of the silicon-containing substrate is smaller than an area of the substrate region with respect to the first side of the silicon-containing substrate.

9. The electronic package of claim 1, wherein the distance between the any two of the conductive pads is from 250 µm to 1350 µm, and the width of the conductive pads is from 180 µm to 750 µm.

10. The electronic package of claim 1, further comprising an insulating protective layer formed on the circuit structure, with the conductive pads exposed from the insulating protective layer.

11. The electronic package of claim 1, further comprising an insulating protective layer formed on the second side of the silicon-containing substrate, with the conductive pillars exposed from the insulating protective layer.

12. The electronic package of claim 1, further comprising a circuit portion formed on the second side of the silicon-containing substrate and electrically connected with the conductive pillars.

13. An electronic package, comprising:
    a silicon-containing substrate including a first side and a second side opposite to the first side;
    a plurality of conductive pillars formed in the silicon-containing substrate;
    a circuit structure formed on the first side of the silicon-containing substrate and electrically connected with the conductive pillars, wherein the circuit structure includes a plurality of conductive pads each having a width ranging from 150 µm to 800 µm, and any two of the conductive pads are spaced apart at a distance ranging from 200 µm to 1500 µm;
    an electronic component provided on the second side of the silicon-containing substrate and electrically connected with the conductive pillars; and
    a first packaging material of a single continuous structure formed on the silicon-containing substrate and encapsulating the electronic component, wherein the first packaging material is further formed between the second side of the silicon-containing substrate and the electronic component and extends onto an entire lateral side of the silicon-containing substrate and the circuit structure.

14. The electronic package of claim 13, further comprising an encapsulating layer formed between the second side of the silicon-containing substrate and the electronic component.

15. The electronic package of claim 1, wherein a portion of a surface of the electronic component is exposed from the first packaging material and the second packaging material.

16. The electronic package of claim 13, wherein a portion of a surface of the electronic component is exposed from the first packaging material.

17. The electronic package of claim 13, further comprising a plurality of conductive elements provided on and electrically connected with the conductive pads.

18. The electronic package of claim 13, wherein the circuit structure further includes at least a dielectric layer, a circuit layer formed on the at least a dielectric layer, and a plurality of conductive vias provided in the at least a dielectric layer and electrically connected with the circuit layer.

19. The electronic package of claim 13, wherein the circuit layer at an outermost side of the circuit structure serves as the conductive pads.

20. The electronic package of claim 13, wherein the silicon-containing substrate has a length or a width ranging from 3 mm to 125 mm.

21. The electronic package of claim 20, wherein at least one of the length and the width of the silicon-containing substrate is from 10 mm to 90 mm.

22. The electronic package of claim 13, wherein the silicon-containing substrate is defined with a through-hole region and a substrate region adjacent to the through-hole region, and wherein the substrate region surrounds the through-hole region, and the conductive pillars are located in the through-hole region.

23. The electronic package of claim 22, wherein the conductive pads are located in at least one of the through-hole region and the substrate region.

24. The electronic package of claim 22, wherein an area of the through-hole region with respect to the first side of the silicon-containing substrate is smaller than an area of the substrate region with respect to the first side of the silicon-containing substrate.

25. The electronic package of claim 13, wherein the distance between the any two of the conductive pads is from 250 μm to 1350 μm, and the width of the conductive pads is from 180 μm to 750 μm.

26. The electronic package of claim 13, further comprising an insulating protective layer formed on the circuit structure, with the conductive pads exposed from the insulating protective layer.

27. The electronic package of claim 13, further comprising an insulating protective layer formed on the second side of the silicon-containing substrate, with the conductive pillars exposed from the insulating protective layer.

28. The electronic package of claim 13, further comprising a circuit portion formed on the second side of the silicon-containing substrate and electrically connected with the conductive pillars.

29. The electronic package of claim 1, further comprising an encapsulating layer formed between the second side of the silicon-containing substrate and the electronic component.

30. The electronic package of claim 1, further comprising a plurality of conductive elements provided on and electrically connected with the conductive pads.

* * * * *